United States Patent
Hilgers

(10) Patent No.: US 7,696,936 B2
(45) Date of Patent: Apr. 13, 2010

(54) METHOD OF AND DEVICE FOR DETERMINING AT LEAST ONE CHARACTERISTIC PARAMETER OF A RESONANT STRUCTURE

(75) Inventor: Achim Hilgers, Alsdorf (DE)

(73) Assignee: NXP B.V., Eindhoven (NL)

( * ) Notice: Subject to any disclaimer, the term of this patent is extended or adjusted under 35 U.S.C. 154(b) by 547 days.

(21) Appl. No.: 10/591,552

(22) PCT Filed: Mar. 2, 2005

(86) PCT No.: PCT/IB2005/050761

§ 371 (c)(1),
(2), (4) Date: Aug. 13, 2007

(87) PCT Pub. No.: WO2005/086279

PCT Pub. Date: Sep. 15, 2005

(65) Prior Publication Data

US 2008/0284664 A1 Nov. 20, 2008

(30) Foreign Application Priority Data

Mar. 5, 2004 (EP) .................................. 04100889

(51) Int. Cl.
*G01R 29/10* (2006.01)
(52) U.S. Cl. .................. 343/703; 340/572.1; 340/572.5; 324/623; 324/627; 324/639; 324/537
(58) Field of Classification Search .................. 343/703
See application file for complete search history.

(56) References Cited

U.S. PATENT DOCUMENTS

| 4,160,971 | A | * | 7/1979 | Jones et al. ............ 340/870.26 |
| 6,104,291 | A | | 8/2000 | Beauvillier et al. |
| 6,255,830 | B1 | * | 7/2001 | Rollin et al. ................ 324/627 |
| 7,068,231 | B2 | * | 6/2006 | Huang ........................ 343/703 |

FOREIGN PATENT DOCUMENTS

DE    101 17 249    11/2002

* cited by examiner

*Primary Examiner*—Trinh V Dinh

(57) ABSTRACT

A method of determining at least one characteristic parameter of a resonant structure (4) comprising the following steps: firstly placing the resonant structure (4) at a location, said location being located in the far field of a first antenna (2) and in the far field of a second antenna (5), and secondly emitting electromagnetic waves (EEW) with different frequencies in a given frequency range by means of the first antenna (2) such that the emitted electromagnetic waves (EEW) are modified by the resonant structure (4) and modified electromagnetic waves (MEW) are achieved, and thirdly determining during a first determining step a first electric power-value being representative of the power associated with the emitted electromagnetic waves (EEW), and fourthly receiving the generated modified electromagnetic waves (MEW) by means of the second antenna (5) and fifthly determining during a second determining step a second electric power-value being representative of the power associated with the received modified electromagnetic waves (MEW), and sixthly determining the at least one characteristic parameter by using the first and second power-values determined during the first and second determining steps.

21 Claims, 1 Drawing Sheet

METHOD OF AND DEVICE FOR DETERMINING AT LEAST ONE CHARACTERISTIC PARAMETER OF A RESONANT STRUCTURE

RELATED APPLICATIONS

This application is a 371 of PCT/IB05/50761 filed Mar. 2, 2005, which claims priority under 35 U.S.C. 119 to an application 04100889.7 filed Mar. 5, 2004 in the European Office, the contents of which are incorporated herein by reference.

FIELD OF THE INVENTION

The invention relates to a method of determining at least one characteristic parameter of a resonant structure.

Furthermore the invention relates to a device for determining at least one characteristic parameter of a resonant structure.

BACKGROUND OF THE INVENTION

The invention can be used to test and tune resonant electric structures such as antenna or transponders, particularly transponders for "Radio Frequency Identification" systems, shortly RFID systems.

Automatic and wireless identification systems such as transponder systems are more and more important and gradually replace well-known barcodes. Such a transponder system comprises a reader and at least one transponder. A transponder comprises firstly a chip comprising e.g. all relevant data identifying a product and secondly a transponder antenna capable to operate in the relevant frequency band. The transponder antenna is part of a resonant electric structure realized by a resonant electric circuit. In this respect ISM bands such as the American UHF band ranging from 902 MHz to 928 MHz can be used. A reader comprises a reader antenna. By means of the transponder antenna and the reader antenna a bi-directional and wireless communication between the transponder and the reader is enabled.

An exchange of information with a transponder being a few meters away from the reader needs processing means operating in the radio frequency range, particularly above 800 MHz. These systems are as already mentioned commonly called "Radio Frequency Identification" systems, shortly RFID systems.

In order to obtain desired information from a passive transponder the reader initiates the reader antenna to emit electromagnetic waves having a wavelength λ wherein said emitted electromagnetic waves cause an electromagnetic field. The resonant electric structure of the transponder is designed to have a resonance frequency corresponding to the wavelength λ and thus absorbs energy from the electromagnetic field. The energy absorbed is used to operate the chip. Switching a load-modulation switch on and off results in an amplitude modulation of the electromagnetic waves generated and emitted by the reader and transmitted to the transponder. If this switching procedure of the load-modulation switch being controlled by data stored in the transponder, these data will be transmitted to the reader. This way of data transmission is called load modulation.

In the patent document DE 101 17 249 A1 a wireless test device for a coil being disclosed that coil being provided for usage in a transponder. The coil is subjected to a radio frequency (RF) field of varying frequency. The RF field is influenced and modified by the coil resulting in a modified RF field and the modified RF field being detected by an antenna. As the coil is located very close to the antenna the coil is positioned in its near field.

In the patent document U.S. Pat. No. 6,104,291 a method to test RFID tags being disclosed. The RFID tag is positioned in the near field of a reader antenna to communicate with the reader. Various commands and functions of the RFID tag are tested and information such as programming, identification, and the like are transmitted to the tag.

OBJECT AND SUMMARY OF THE INVENTION

It is an object of the invention to provide a wireless method of and a corresponding device for determining at least one characteristic parameter and/or property of a resonant structure and for delivering characteristic results in order to enable to tune the resonant structure according to the characteristic results.

It is another object of the invention to determine in a wireless way the resonance frequency and the transmission efficiency of a resonant structure.

According to the present invention the above-mentioned objects are achieved by providing the features defined in the independent claims. Preferred embodiments according to the invention comprise additionally the features defined in the sub-claims.

A method in accordance with the invention can be characterized in the manner specified below, namely:

Method of determining at least one characteristic parameter of a resonant structure comprising the following steps:

a) placing the resonant structure at a location, said location being located in the far field of a first antenna and in the far field of a second antenna, and b) emitting electromagnetic waves with varying frequencies in a given frequency range by means of the first antenna such that the emitted electromagnetic waves are modified by the resonant structure and modified electromagnetic waves are achieved, and c) determining during a first determining step a first electric power-value being representative of the power associated with the emitted electromagnetic waves, and d) receiving the achieved modified electromagnetic waves by means of the second antenna, and e) determining during a second determining step a second electric power-value being representative of the power associated with the received modified electromagnetic waves, and f) determining the at least one characteristic parameter by using the first and second power-values determined during the first and second determining steps.

A device in accordance with the invention can be characterized in the manner specified below, namely:

Device for determining at least one characteristic parameter of a resonant structure, including:

a) a first antenna and b) a second antenna, and c) a retaining device for retaining the resonant structure at a location, said location being located in the far field of the first antenna and in the far field of the second antenna, d) a signal generator for generating an HF-signal with varying frequencies, wherein the HF-signal generated by the signal generator is transferable to the first antenna, said first antenna being provided for emitting electromagnetic waves with varying frequencies to the resonant structure, said resonant structure takes care for modifying the emitted electromagnetic waves and for achieving modified electromagnetic waves and said second antenna being provided for receiving the generated modified electromagnetic waves, and e) a first determining device for determining a first electric power-value representative of the power associated with the emitted electromagnetic waves emitted by the first antenna and for generating a first determining result f) and a second determining device a for determining a second electric power-value representative of the power associated with the received modified electromagnetic waves received by the second antenna and for generating a second determining result, and g) processing means for processing the first electric power-value and the second electric power-value and for determining the at least one characteristic parameter by using the first and second power-values.

The new method rests on the idea that a convincing value of a characteristic parameter of a resonant structure, for example the input/output circuit of a transponder, can only be obtained if testing is performed under conditions similar to those under which the transponder is designed to operate. Thus if a transponder for an RFID system is designed to operate in the far field of a reader, the transponder should be located in the far field of a radiation source when being tested by means of the method according to the invention and by means of the device according to the invention.

The underlying reason for this requirement is that the input impedance $Z_{ant}$ of the antenna depends on environmental conditions of the transponder. If, for example, a transponder is designed to work in the far field of a reader, but is placed in the near field of the reader, the impedance $Z_{ant}$ is normally ill matched to its desired value which is the conjugate complex value of the impedance $Z_{chip}$ of the chip (in this case the transmission efficiency of the transponder is the best). The reason is that the near field coupling of the transponder is being disturbed. If the distance between reader and transponder is increased, the impedance $Z_{ant}$ changes and gets closer to its desired value.

It should be emphasized that the parameters obtained are those of the resonant structure as a whole. If a transponder is tested the parameter obtained is characteristic of the transponder as a whole, and not of its chip alone or its antenna alone.

With the method according to the invention the resonant structure is placed at a location, said location being located in the far field of the first antenna and in the far field of the second antenna. A position in the far field of an antenna is obtained when the distance between the resonant structure and the antenna is at least three times as long as the wavelength of waves applied to or received by the antenna.

During a determining procedure a signal generator, preferred a network analyzer, will be output an HF signal that HF signal will be transmitted to the first antenna. The power-value of the output HF signal is known in the signal generator. Therefore this first power-value can be determined in a very simple way. The first antenna emits electromagnetic waves corresponding to the HF signal. During the determining procedure the frequency of the electromagnetic waves emitted by the first antenna is swept between a first predetermined frequency-value and a second predetermined frequency-value by sweeping the HF signal generated and output by the signal generator. In course of the transmission of the emitted electromagnetic waves from the first antenna to the second antenna the transmission is being influenced and modified by the transponder. This approach makes it possible to measure the transmission spectrum between the two antennas. Hence one or more characteristic parameters of the resonant electric structure can be determined.

The frequency sweep can be realized by using a signal generator with a sweeping function. The electric power needed for generating the emitted electromagnetic waves can directly be the output power of the signal generator. But it is also possible and advantageous to provide in addition an amplifier for amplifying the output signal of the signal generator.

The electromagnetic waves may have frequencies in the radio frequency (RF) range which should include frequencies between about 1 MHz and about 5.6 GHz, that means that an interesting frequency range around 2.45 MHz being incorporated. Preferably they have frequencies above 800 MHz, more preferably in the American UHF band ranging from 902 MHz to 928 MHz.

In general every device being able to absorb electromagnetic waves and to emit electromagnetic waves can be tested in the way just described. The approach is however particularly useful if a resonant structure is tested, for example a resonant structure comprising an antenna, because in this case the transmission shows a pronounced frequency dependence. Preferably the method is used to characterize and test transponders, particularly transponders of RFID systems. These transponders can be of a passive type having no independent energy source of their own. In the alternative semi-passive or active transponders or tags can be tested having an independent energy source (for example a battery) of their own.

For practical reasons the electromagnetic waves travel through an anechoic space. The anechoic space being realized by means of an anechoic chamber wherein the first antenna and the resonant structure and the second antenna are accommodated in the chamber. In this way the signal received by the second antenna is not affected by other signals which might distort the result of the measuring procedure. As an example, the anechoic chamber suppresses multi-path propagations.

In order to compensate for losses due to determining devices, like measuring devices, and the environment a calibration is necessary. A through-calibration can be provided chosen for this purpose. This type of calibration compensates for effects like standing waves, free field damping and the like.

In the alternative a 2-port calibration can be provided. This type of calibration takes the reflections of the antennas into account. With a 2-port calibration values of a measurement are absolute quantities that can be easily compared with values of other manufacturers, and not only with samples analysed with the same set-up.

During a determining procedure the output HF signal of a signal generator will be transmitted to the first antenna. The first antenna emits electromagnetic waves in a direction to the second antenna. The resonant structure is positioned between the first antenna and the second antenna and modifies the emitted electromagnetic waves. A retaining device is used for retaining the resonant structure in the far field of the first antenna and in the far field of the second antenna. The second antenna receives the modified electromagnetic waves.

To investigate the properties of RFID transponders the first antenna and the second antenna are realized for emitting and receiving electromagnetic waves in the radio frequency range. Conventional dipole antennas, micro-patch antennas or a metallic hollow wave-guide of a rectangular shape or other types can be used. It is preferred that the first antenna being realized by a Tx-antenna and the second antenna by an Rx-antenna.

The transponder is arranged between the first antenna and the second antenna. For this purpose a retaining device should be provided which retaining device does not effect the transmission between the two antennas. Particularly useful is a retaining device that contains an electric isolator having a low dielectric constant and a low permeability. Preferably the dielectric constant is close to 1, and the permeability is also close to 1. The device may consist entirely of this material, but it is also possible to cover the retaining device with such an RF-absorbing material. The retaining device may comprise a rotating movable table enabling the investigation of the angular dependence of the characteristic parameters.

The second antenna receives electromagnetic waves originating from the resonant structure and the first antenna. The received electromagnetic waves will be transformed into an alternating current. By means of a measuring unit for measuring the alternating current the electric power-value associated with the alternating current will be determined. For this measuring procedure a conventional power meter can be used.

In the alternative the afore mentioned electric power-value is measured by the same network analyzer which measures or knows the electric power-value needed for generating the electromagnetic waves by the first antenna. In the second case the measured power-value is the value of the input power of the network analyzer.

As the input power-value and the output power-value are determined for all frequencies by means of the network analyzer, this allows—by means of the network analyzer provided as processing means for processing the output power-value as a first power-value and the input power-value as a second power-value—for the determination of the radiation behaviour as a characteristic parameter of the resonant structure, as the output power is influenced by the radiation performance. Experiments have shown that a higher transmission of the resonant structure means that this structure has a higher relative transmission efficiency. In other words the invention makes it possible to determine the relative transmission efficiency of a resonant structure.

Knowing the (relative) transmission efficiency allows to tune the resonant structure. In the case of a transponder the transmission, and hence the transmission efficiency, depends on the chip and the antenna and the matching between these two parts. As an example it is possible to always take the same antenna and to test whether the transmission efficiency is improved if a chip is used instead of another chip. This can be used to find out which combination yields the highest efficiency. The other way round it is possible to find the best antenna for a given chip by measuring the transmission of a transponder which always consists of this chip and of one of various antennas. Furthermore different approaches to match the parts can be tested to find out which kind of matching yields the highest transmission efficiency.

If the output power of the network analyzer is not sufficient high the electromagnetic waves can be transmitted to the first antenna via an amplifier.

As described above the method just described allows for the determination of the resonance frequency and the relative transmission efficiency of the resonant structure, and allows for a subsequent tuning of the structure. That means that determination of two characteristic parameters is achieved.

These and other aspects of the invention will be apparent from and elucidated with reference to the embodiments described thereafter.

DESCRIPTION OF EMBODIMENTS

Figure 1:
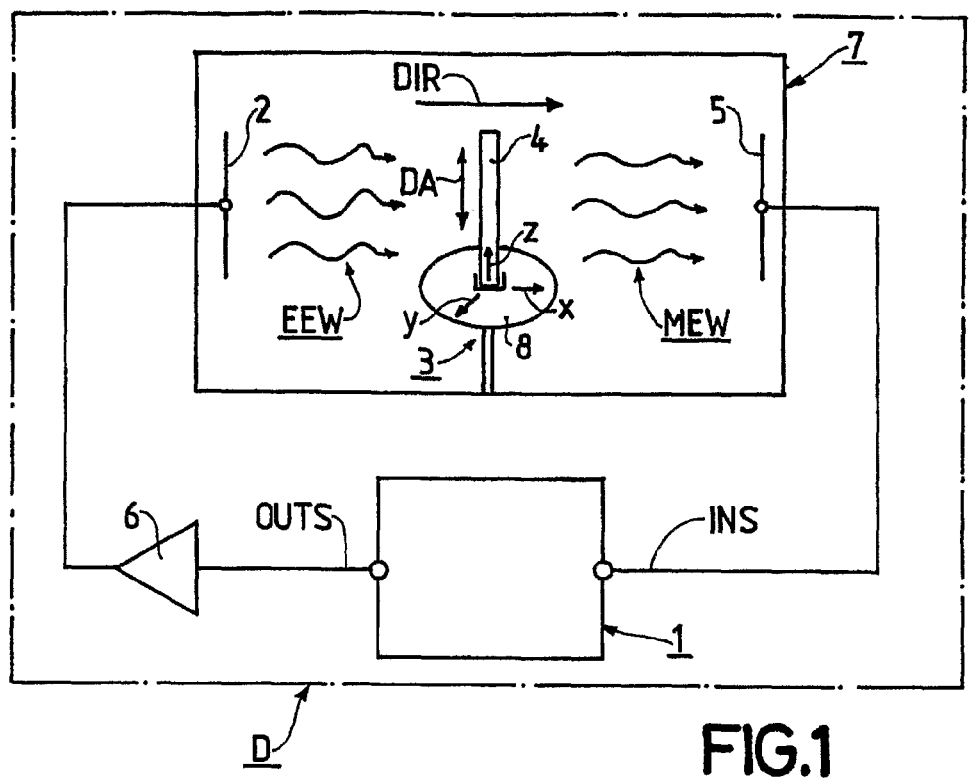
FIG. 1 shows a diagrammatic representation of a device for measuring characteristic parameters of a transponder.

FIG. 1 shows an embodiment of a device D according to the present invention. The device D is provided for determining one or more characteristic parameters of a resonant electric structure.

A network analyzer 1 having a sweeping function generates an electric signal, namely an HF-signal OUTS with a varying frequency in the range between 815 MHz and 1015 MHz having a predetermined output level said level is in a range of −15 dBm to +3 dBm. The HF-signal OUTS flows from a port A of the network analyzer 1 to an RF amplifier 6 having a gain of 20 dB. The output power-value at port A—being representative of the power associated with emitted electromagnetic waves EEW—is determined by the network analyzer 1 by a measuring procedure done in the network analyzer 1. With another embodiment of a network analyzer 1 the determination of the output power can be achieved in that way that the value of the chosen output power is simply known in the network analyzer 1 and therefore can be determined in a very simple and time saving way. The amplified HF-signal OUTS is then fed to a first antenna 2 realized by a Tx-antenna. The Tx-antenna emits electromagnetic waves EEW in a direction DIR to a transponder 4 and to a second antenna 5 realized by an Rx-antenna.

The transponder 4 is provided and realized for operating in a frequency range of 902 MHz to 928 MHz. The transponder 4 absorbs energy from the electromagnetic field generated by the first antenna 2 by means of the emitted electromagnetic waves. Such absorbing results in a modification of the emitted electromagnetic waves EEW so that modified electromagnetic waves MEW are achieved. The modified electromagnetic waves MEW are subsequently received with the second antenna 5. The second antenna 5 generates an electric signal INS. The electric signal INS is fed to the network analyzer 1 via a port B of the network analyzer 1. The input power-value at the port B—being representative of the power associated with the received modified electromagnetic waves MEW—being measured by the network analyzer 1.

The transponder 4 is located between the two antennas 2 and 5. The distance between the transponder 4 and the first antenna 2 and the distance between the transponder 4 and the second antenna 5 are at least 1 m each such that the transponder 4 is in the far-field of the first antenna 2 and in the far field of the second antenna 2. The location of the transponder 4 can be changed along the z-axis as indicated by the vertical double-arrow DA. For retaining the transponder 4 a rotating movable table 8 has been provided. By means of that table 8 it is enabled to determine the transmission TR dependent on the angle position of the transponder 4 in the xy-plane. The transmission is equal to the ratio between output power-value at port A and input power-value at port B. In case that the dependence of the transmission TR with respect to the angle position is of no interest it is possible to retain the transponder 4 to the ceiling of the anechoic chamber 7 by means of a string (not shown). The string is made of material with a low dielectric constant and a low permeability constant, both preferably equal or close to 1. In practice during test procedures a plastic material was chosen for such a string.

Figure 2:
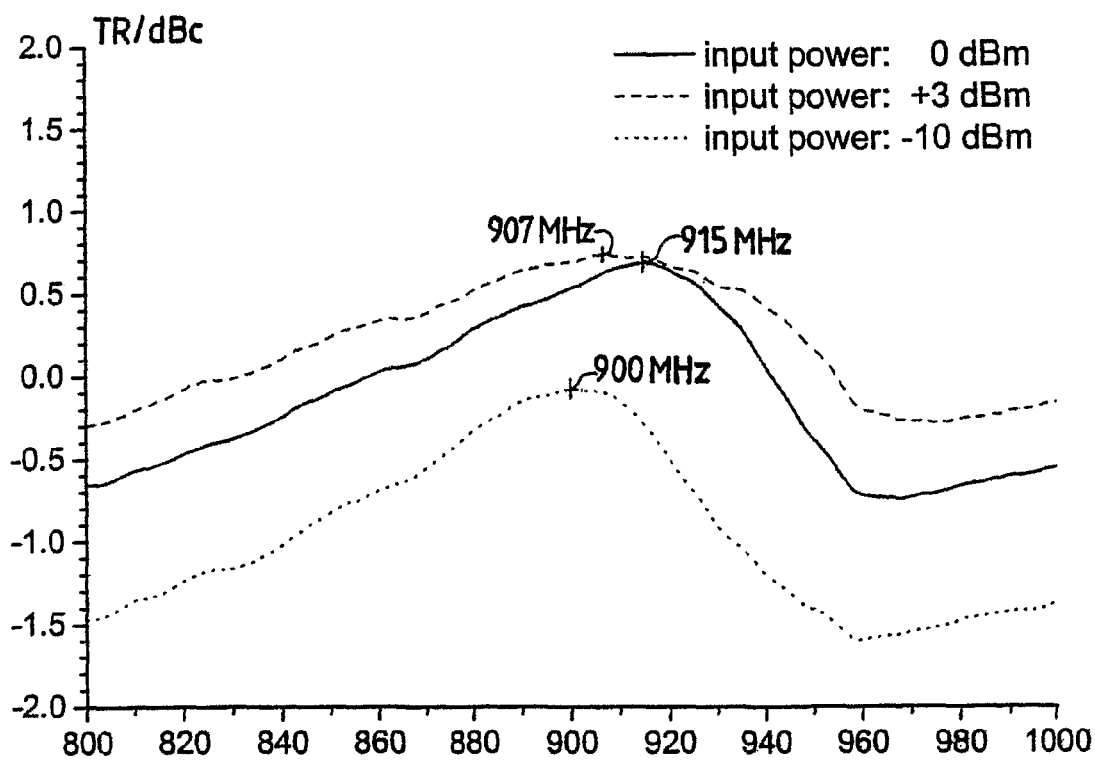
FIG. 2 shows a transmission spectrum of the transponder shown in FIG. 1 at three different power levels of a network analyser of the device according to FIG. 1.

FIG. 2 is a plot of transmission TR versus frequency f for three different output power-values of network analyzer 1, namely 0 dBm, +3 dBm and −10 dBm. The plot is typical for a resonant structure. As the frequency at which the curves show a maximum value (900 MHz for an input power of −10 dBm, 907 MHz for an input power of +3 dBm, 915 MHz for an input power of −0 dBm) represents the resonance frequency the question is which curves yields the "true" resonance frequency of the transponder 4.

As mentioned above the transmission efficiency of a transponder comprising an antenna and a chip is the best when the value of the impedance $Z_{ant}$ of its antenna is equal to the conjugate complex value of the impedance $Z_{chip}$ of its chip, that means $Z_{ant}=Z_{chip}$. If this condition is satisfied the radiating performance of the transponder is highest and the transmission determined by the network analyzer 1 as well. As can be seen from FIG. 2 the most suitable transmission is achieved for an input power of 0 dBm. Hence the true resonance frequency of the tested transponder 4 is 915 MHz. This is the center frequency of the frequency band 902 MHz to 928 MHz in which the transponder 4 is designed to operate.

If the input power is chosen to be lower, namely −10 dBm, the transponder can not absorb enough energy from the electromagnetic field to start operation. If the input power is chosen to be higher, namely +3 dBm, the electric voltage induced in transponder 5 becomes too high. Surplus energy then flows to a complex impedance, which in turn changes the impedance of the chip. This changes the resonance frequency to lower values. As can be seen the spectrum for an input power of +3 dBm is also broadened, which has its origin in the additional impedance theoretically being in parallel to the chip.

If the resonance frequency of the transponder 4 is found to be too low this can be used to tune the transponder by shortening the lines of its antenna. If the resonance frequency of the transponder 4 is found to be too high the lines of the antenna will have to be made longer.

The invention clamed is:

1. Device (D) for determining at least one characteristic parameter (TR) of a resonant structure, including:
   a) a first antenna and
   b) a second antenna, and
   c) a retaining device for retaining the resonant structure at a location, said location being located in the far field of the first antenna and in the far field of the second antenna,
   d) a signal generator for generating an HF-signal (OUTS) with varying frequencies, wherein the HF-signal (OUTS) generated by the signal generator is transferable to the first antenna, said first antenna being provided for emitting electromagnetic waves (EEW) with varying frequencies to the resonant structure, said resonant structure takes care for modifying the emitted electromagnetic waves (EEW) and for achieving modified electromagnetic waves (MEW) and said second antenna being provided for receiving the generated modified electromagnetic waves (MEW), and
   e) a first determining device for determining a first electric power-value representative of the power associated with the emitted electromagnetic waves (EEW) emitted by the first antenna and for generating a first determining result
   f) a second determining device a for determining a second electric power-value representative of the power associated with the received modified electromagnetic waves (MEW) received by the second antenna and for generating a second determining result, and
   g) processing means for processing the first electric power-value and the second electric power-value and for determining the at least one characteristic parameter (TR) by using the first and second power-values.

2. Device (D) according to claim 1, characterized in that the signal generator is realized by a network analyzer.

3. Device (D) according to claim 2, characterized in that the determining apparatus being realized by the network analyzer.

4. Device (D) according to claim 2, characterized in that the processing means are realized by the network analyzer.

5. Device (D) according to claim 1, characterized in that the signal generator is connected to the first antenna via an amplifier.

6. Device (D) according to claim 1, characterized in that both the first determining device and the second determining device are realized by one determining apparatus.

7. Device (D) according to claim 6, characterized in that the first antenna is realized by a Tx-antenna and the second antenna is realized by an &-antenna.

8. Device (D) according to claim 1, characterized in that the first antenna and the retaining device and the second antenna are positioned in an anechoic chamber.

9. Device (D) according to claim 1, characterized in that the first antenna and the second antenna are realized for emitting and receiving electromagnetic waves (EEW, MEW) in the radio frequency range.

10. Device (D) according to claim 1, characterized in that the retaining device includes a rotating movable table.

11. Device (D) according to claim 1, characterized in that the material of the retaining device consists at least mainly of a material having a dielectric constant close to 1 and a permeability close to 1.

12. Method of determining at least one characteristic parameter (TR) of a resonant structure comprising the following steps:
   a) placing the resonant structure at a location, said location being located in the far field of a first antenna and in the far field of a second antenna and
   b) emitting electromagnetic waves (EEW) with varying frequencies in a given frequency range by means of the first antenna such that the emitted electromagnetic waves (EEW) are modified by the resonant structure (4) and modified electromagnetic waves (MEW) are achieved, and
   c) determining during a first determining step a first electric power-value being representative of the power associated with the emitted electromagnetic waves (EEW), and
   d) receiving the achieved modified electromagnetic waves (MEW) by means of the second antenna and
   e) determining during a second determining step a second electric power-value being representative of the power associated with the received modified electromagnetic waves (MEW), and
   f) determining the at least one characteristic parameter by using the first and second power-values determined during the first and second determining steps.

13. Method according to claim 12, characterized in that the electromagnetic waves (EEW, MEW) have frequencies in the radio frequency region.

14. Method according to claim 12, characterized in that the electromagnetic waves (EEW, MEW) have frequencies above 800 MHz.

15. Method according to claim 12, characterized in that at least one characteristic parameter of an antenna or a transponder are determined.

16. Method according to claim 12, characterized in that the electromagnetic waves (EEW, MEW) travel through an anechoic space.

17. Method according to claim 12, characterized in that a through-calibration is performed for a determining apparatus for performing the first and second determining steps.

18. Method according to claim 12, characterized in that a 2-port calibration is performed for a determining apparatus for performing the first and second determining steps.

19. Method according to claim 12, characterized in that the electric power determined during the first and second determining steps are determined by means of a network analyzer.

20. Method according to claim 12, characterized in that the resonance frequency of the resonant structure is determined.

21. Method according to claim 12, characterized in that the relative transmission efficiency (TR) of the resonant structure is determined.

* * * * *